United States Patent [19]

Petersen

[11] Patent Number: 5,376,010
[45] Date of Patent: Dec. 27, 1994

[54] BURN-IN SOCKET

[75] Inventor: Kurt H. Petersen, Austin, Tex.

[73] Assignee: Minnesota Mining and Manufacturing Company, St. Paul, Minn.

[21] Appl. No.: 192,987

[22] Filed: Feb. 8, 1994

[51] Int. Cl.⁵ ............................................ H01R 13/62
[52] U.S. Cl. .................................... 439/71; 439/266; 439/331
[58] Field of Search .................. 439/71, 73, 330, 331, 439/266, 59, 68, 72, 78, 591

[56] References Cited

U.S. PATENT DOCUMENTS

| | | | |
|---|---|---|---|
| 4,376,560 | 3/1983 | Olsson et al. | 439/331 |
| 4,396,935 | 8/1983 | Schuck | 439/331 X |
| 4,715,823 | 12/1987 | Ezura et al. | 439/267 |
| 4,758,176 | 7/1988 | Abe et al. | 439/331 |
| 4,768,973 | 9/1988 | Bakermans | 439/331 |
| 4,801,273 | 1/1989 | Ikeya et al. | 439/269 |
| 4,832,612 | 5/1989 | Grabbe et al. | 439/71 |
| 4,846,704 | 7/1989 | Ikeya | 439/72 |
| 4,923,404 | 5/1990 | Redmond et al. | 439/71 |
| 4,950,980 | 8/1990 | Pfaff | 439/296 |
| 4,969,828 | 11/1990 | Bright et al. | 439/68 |
| 4,986,760 | 1/1991 | Petersen et al. | 439/71 |
| 5,057,031 | 10/1991 | Sinclair | 439/261 |
| 5,068,601 | 11/1991 | Parmenter | 439/331 |
| 5,088,190 | 2/1992 | Malhi et al. | 29/843 |
| 5,123,855 | 6/1992 | Petersen | 439/263 |
| 5,199,890 | 4/1993 | Kubo | 439/72 |
| 5,234,349 | 8/1993 | Matsuoka et al. | 439/70 |

Primary Examiner—Z. R. Bilinsky
Attorney, Agent, or Firm—Gary L. Griswold; Walter N. Kirn; David W. Anderson

[57] ABSTRACT

A burn-in socket for land grid array devices or ball grid array devices includes a receptacle having an array of terminals for accepting and contacting the device and an outer shell which is actuated by rotation of the shell to capture the device and provide a force to ensure electrical contact between the device and the terminals.

11 Claims, 7 Drawing Sheets

BURN-IN SOCKET

FIELD OF THE INVENTION

The present invention relates to sockets for electronic devices which allow the device to be temporarily connected to a printed circuit board for burn-in testing purposes. The invention particularly relates to sockets for land grid array (LGA), one type of which is ball grid array (BGA), devices.

BACKGROUND OF THE INVENTION

During the manufacture of integrated circuit devices, the device is tested by attaching the device to a printed circuit board and electronically testing its functionality. Such testing may be done in a heated environment to accelerate the testing and identify devices which otherwise might fail shortly after being placed in service.

To facilitate this testing, it is necessary to provide a socket permanently attached to the test circuit board which will allow the device to be temporarily connected to the circuit board. Such a socket should allow rapid connection and removal of the device and should not mar the device in any way. In addition, the socket must provide positive contact to all of the electrical connections of the device, and be susceptible to manipulation by automatic production machinery.

Socket of the type described have in the past primarily included abase attached to the test circuit board by means of spring-loaded contacts and a hinged lid which pressed the device down against the contacts. Such sockets have not proven to be easily compatible with modern process equipment, particularly production line robotic equipment.

SUMMARY OF THE INVENTION

The present invention, provides a socket for temporarily connecting to a printed circuit board an integrated circuit device of the type including a body having spaced, planar major surfaces and a number of contacts disposed on one major surface and arranged in an array, the socket comprising a base adapted for mounting on the printed circuit board and including an array of holes, a nest overlying the base and including means for preventing rotation of the nest with respect to the base and an array of holes and means for locating the integrated circuit with respect to the array of holes in the nest, terminals extending through the array of holes in the base and corresponding holes of the array of holes in the nest to form an array of terminals disposed to make connection with the integrated circuit contacts, the terminals including a termination portion for electrical connection to the printed circuit board, a contacting portion for electrical connection to the contacts of the integrated circuit, and a spring portion connecting the terminal portion and the contacting portion and resiliently deformable to allow movement of the contacting portion toward the terminal portion and to produce a force resisting such movement, and a shell including a top surface overlying the nest, means extending from the top surface and engaging the base for retaining the shell in relation to the base and for allowing rotational movement of the shell with respect to the base, an opening in the top surface permitting passage of the integrated circuit through the top surface, and means for applying force upon rotation of the shell with respect to the base and the nest to the major surface of an integrated circuit disposed on the nest and in contact with terminals corresponding to the array of contacts on the integrated circuit sufficient to force the integrated circuit into electrical engagement with the contacting portions of the terminals and cause resilient deformation of the spring portions of the terminals engaged by the integrated circuit.

Force may be applied to the integrated circuit to be tested by means of cam surfaces on the inner surface of the shell top surface which bear downwardly on the integrated circuit when the shell is rotated or by means of a sloped surface on the base which interacts with projections extending from the shell. As the shell projections slide along the sloped surface upon rotation of the shell, the shell is drawn downwardly to apply force to the integrated circuit device or allowed to move upwardly to release the device.

BRIEF DESCRIPTION OF THE DRAWINGS

The present invention will be more thoroughly described with respect to the accompanying drawings, wherein like numbers refer to like parts in the several views, and wherein.

DESCRIPTION OF THE PREFERRED EMBODIMENT

Figure 1:
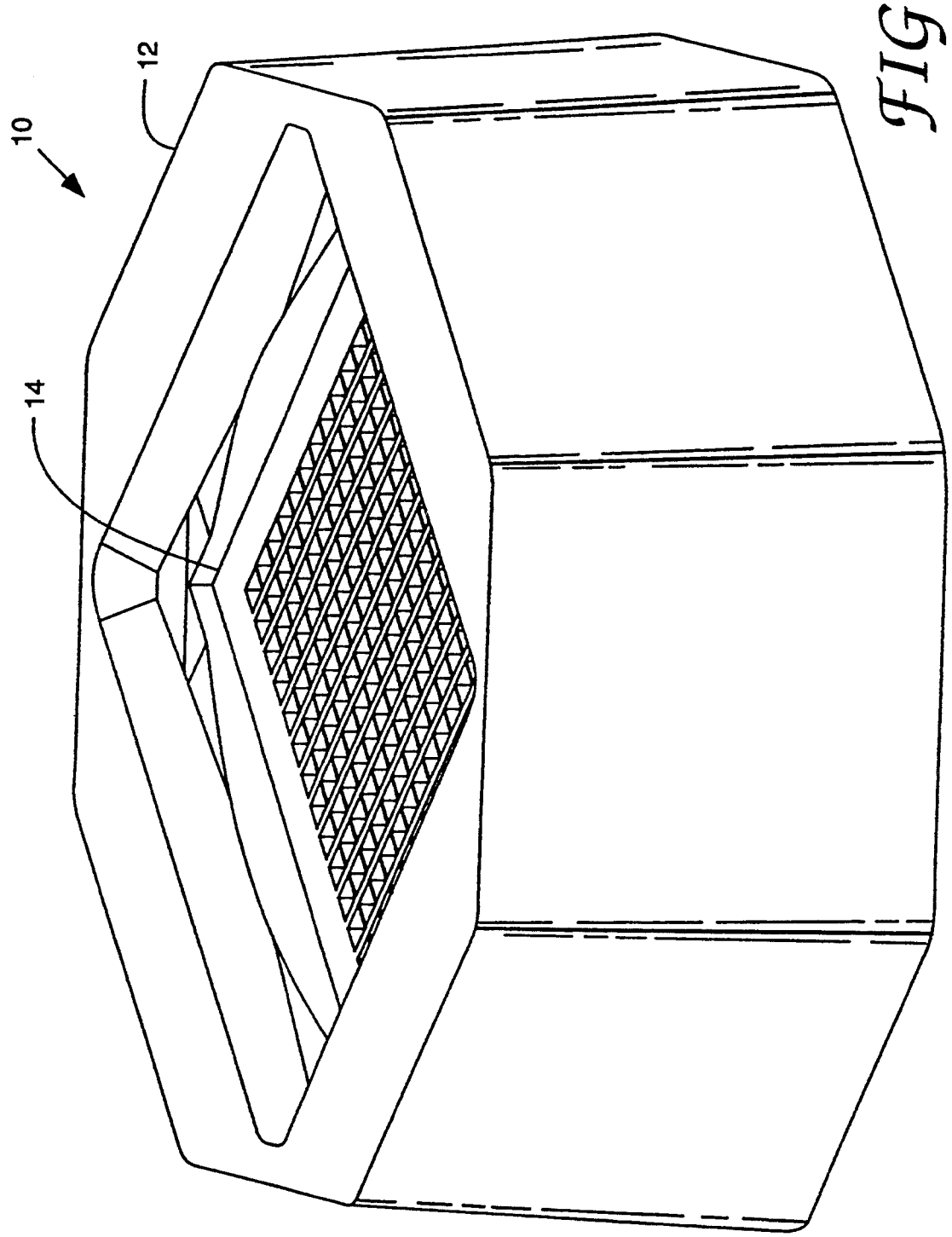
FIG. 1 is a perspective view of a first embodiment of a socket according to the present invention in a position to allow loading of an integrated circuit device.

FIG. 1 illustrates a socket according to the present invention and generally indicated as 10 which is adapted to be attached to a printed circuit board comprising a portion of a testing device for integrated circuit devices. The socket 10 is designed to handle integrated circuit devices of the ball grid array or land grid array types wherein the device is comprised of electronic circuitry encapsulated in a coating which is square or rectangular and has two major surfaces and an array of contact bumps on one major surface.

When integrated circuits are manufactured, it is desirable to test each device by temporarily attaching the device to test equipment which will check the electronic functioning of the device. Such testing may additionally be done in a heated environment to identify those devices which may fail shortly after being put into service. To quickly test a large number of devices, it is necessary to provide means for quickly and reliably temporarily connecting the integrated circuit devices to the test equipment, without damaging the devices. Sockets permanently attached to the test equipment accomplish the goals outlined above. However, existing sockets for integrated circuit devices, particularly those of the ball or land grid array types, have included a base for accepting and electrically contacting the device and a lid which attaches to the base to retain the integrated circuit in contact with the base. These sockets have proven difficult for automatic assembly machinery such a industrial robots to manipulate.

Figure 2:
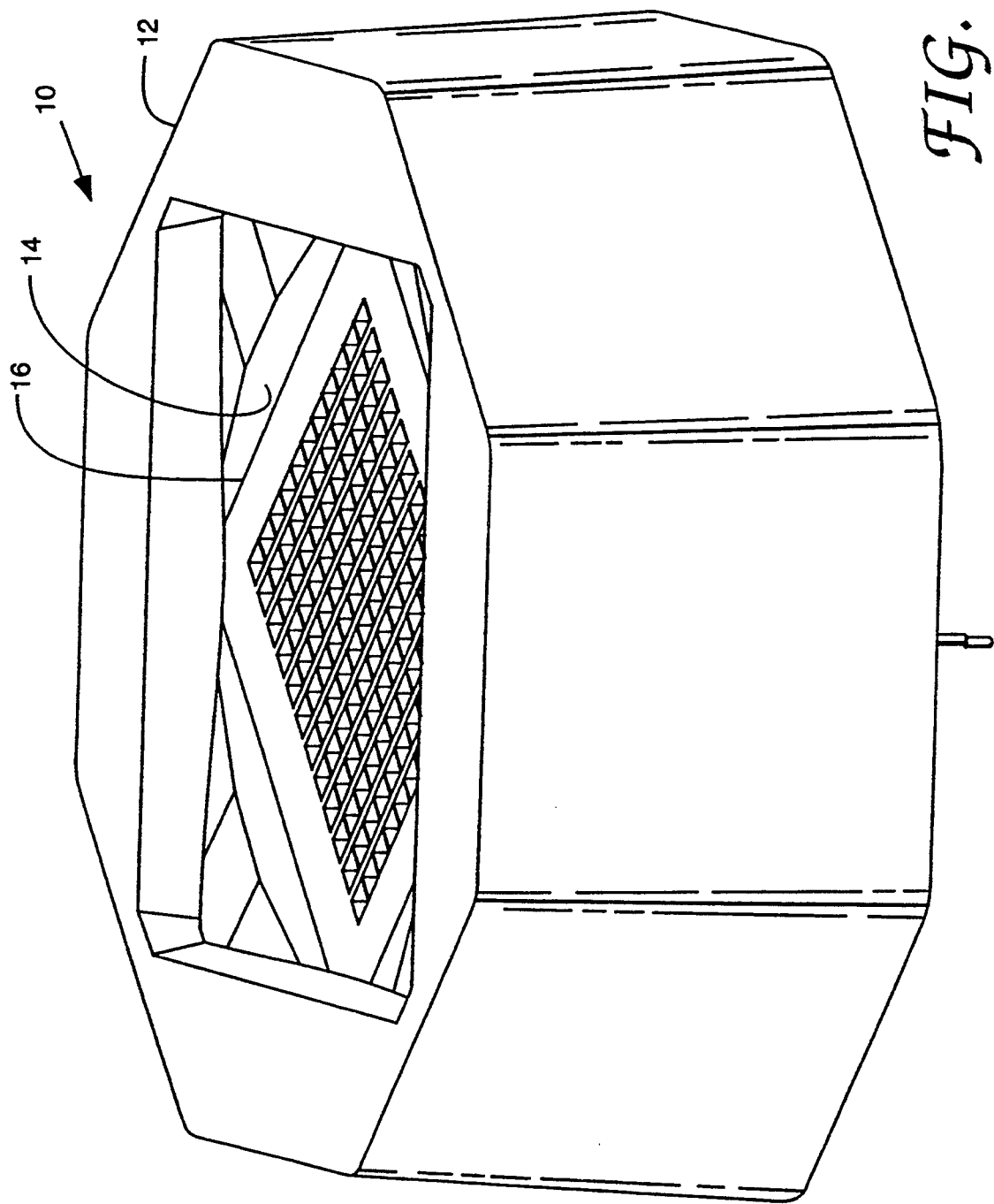
FIG. 2 is a perspective view of the socket of FIG. 1 with an integrated circuit device loaded therein and in a position to retain the integrated circuit device for testing.
Figure 5:
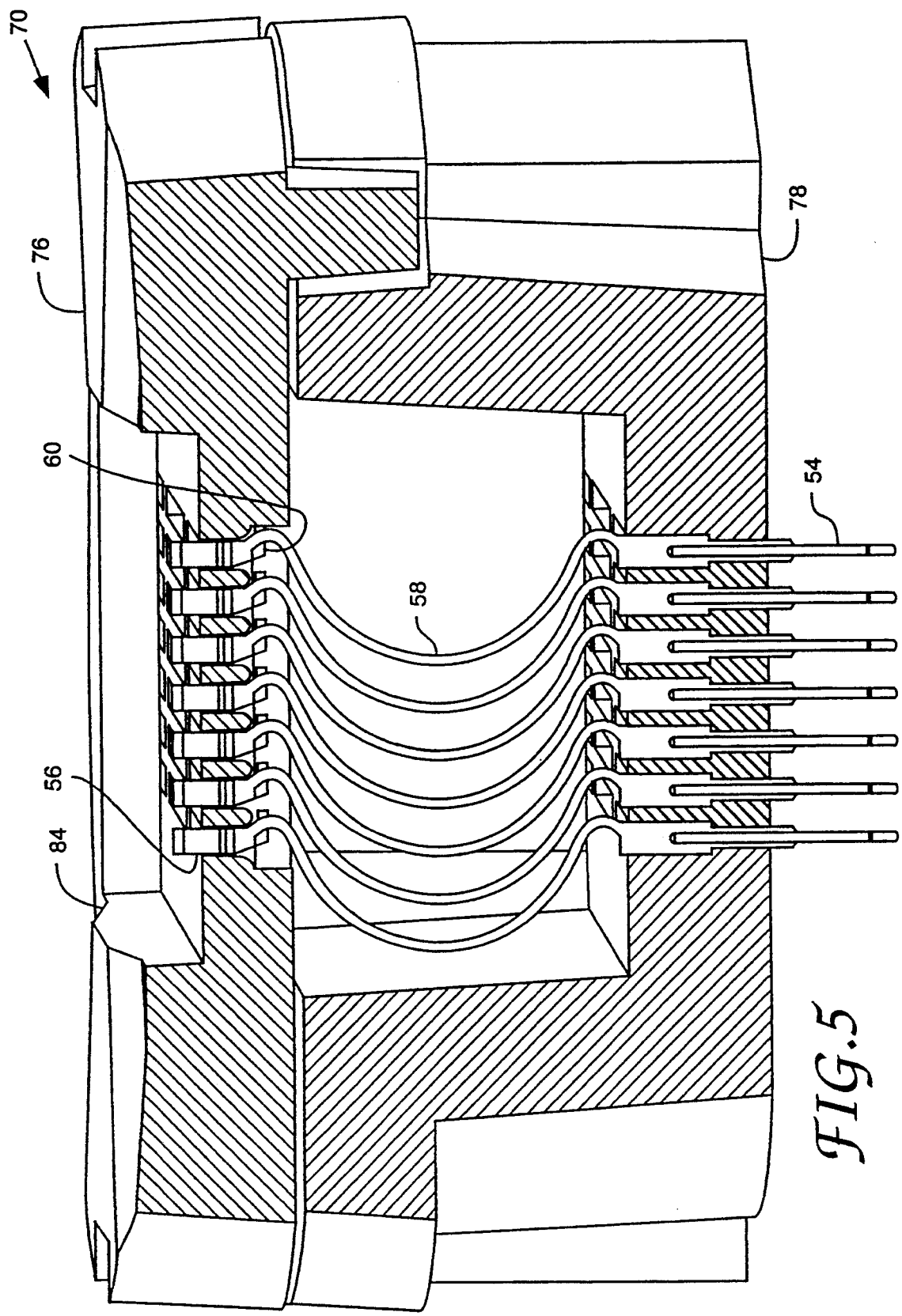
FIG. 5 is a cross-sectional view of a portion of a second embodiment of a socket according to the present invention.

The socket 10 of the present invention utilizes a rotating shell 12 to retain the integrated circuit within a nest 14 having an array of holes through which the contacts of the integrated circuit device may be contacted by terminals such as those which may be seen by temporary reference to FIG. 5. As can be seen in FIG. 1, the shell 12 includes an opening shaped to accept the particular integrated circuit being tested (in this case a square device) and allow the integrated circuit to be placed on the nest 14 by, for example, a vacuum placement mechanism. FIG. 2 illustrates the socket 10 with an integrated circuit device 16 in place and the shell 12 rotated to capture the integrated circuit device 16 by its corners and force the device 16 downwardly.

Figure 3:
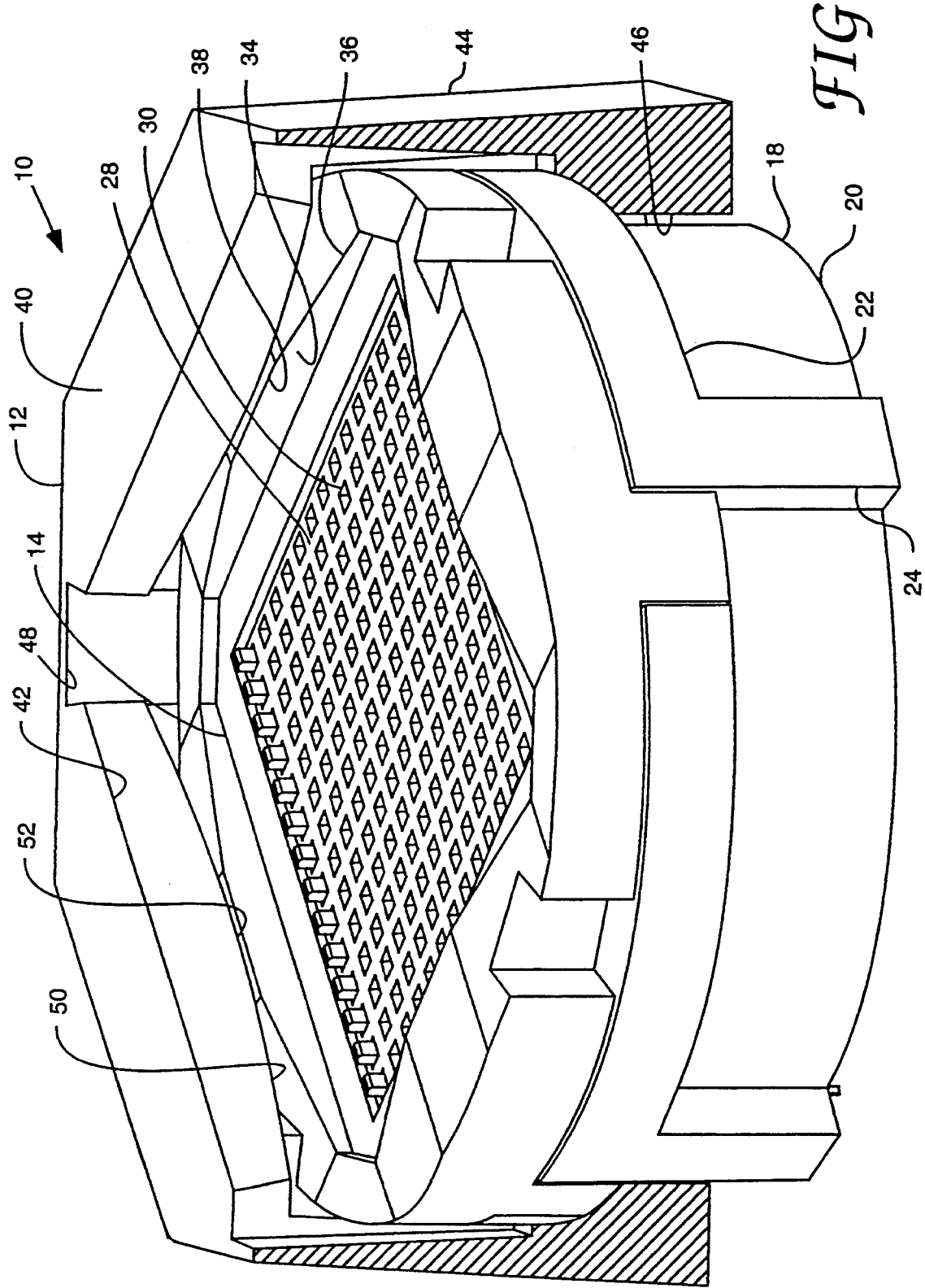
FIG. 3 is a perspective view of the socket of FIG. 1, with a portion shown in cross-section.

FIG. 3 illustrates the socket 10 in greater detail. The socket 10 includes a base 18 which is intended to rest on the printed circuit board of a test device, a nest 14 resting on the base 18 and a shell 12 disposed above and surrounding the base 18 and the nest 14. The base 18 has a circular perimeter 20, a shoulder 22 of increased diameter relative to the perimeter 20, stops 24 extending vertically from the shoulder 22 for limiting rotation of the shell 12 as will explained later, and holes 26 (FIG. 5) arranged in an array corresponding to the arrangement of the contacts on the integrated circuit device 16 to be tested.

The nest 14 is generally planar and sits on the top surface of the base 18. The top surface of the nest 14 includes a flat area 28 having an array of holes 30 corresponding to the array of contacts of the integrated circuit device 16 and the holes 26 in the base 18. Terminals 32 (only one row is shown in FIG. 3) extend through the holes 30 in the nest 14 to contact the contacts disposed on the lower side of the integrated circuit device 16. The nest 14 includes walls 34 surrounding the holes 30 spaced and shaped to accept the integrated circuit device 16. The upper surfaces of the walls 34 terminate in camming surfaces 36 which slope from the corners of the array of holes 30 to a flat surfaces 38 disposed midway along the length of the walls 34. These camming surfaces 36 are utilized in conjunction with the shell 12, as will be described below.

Figure 4:
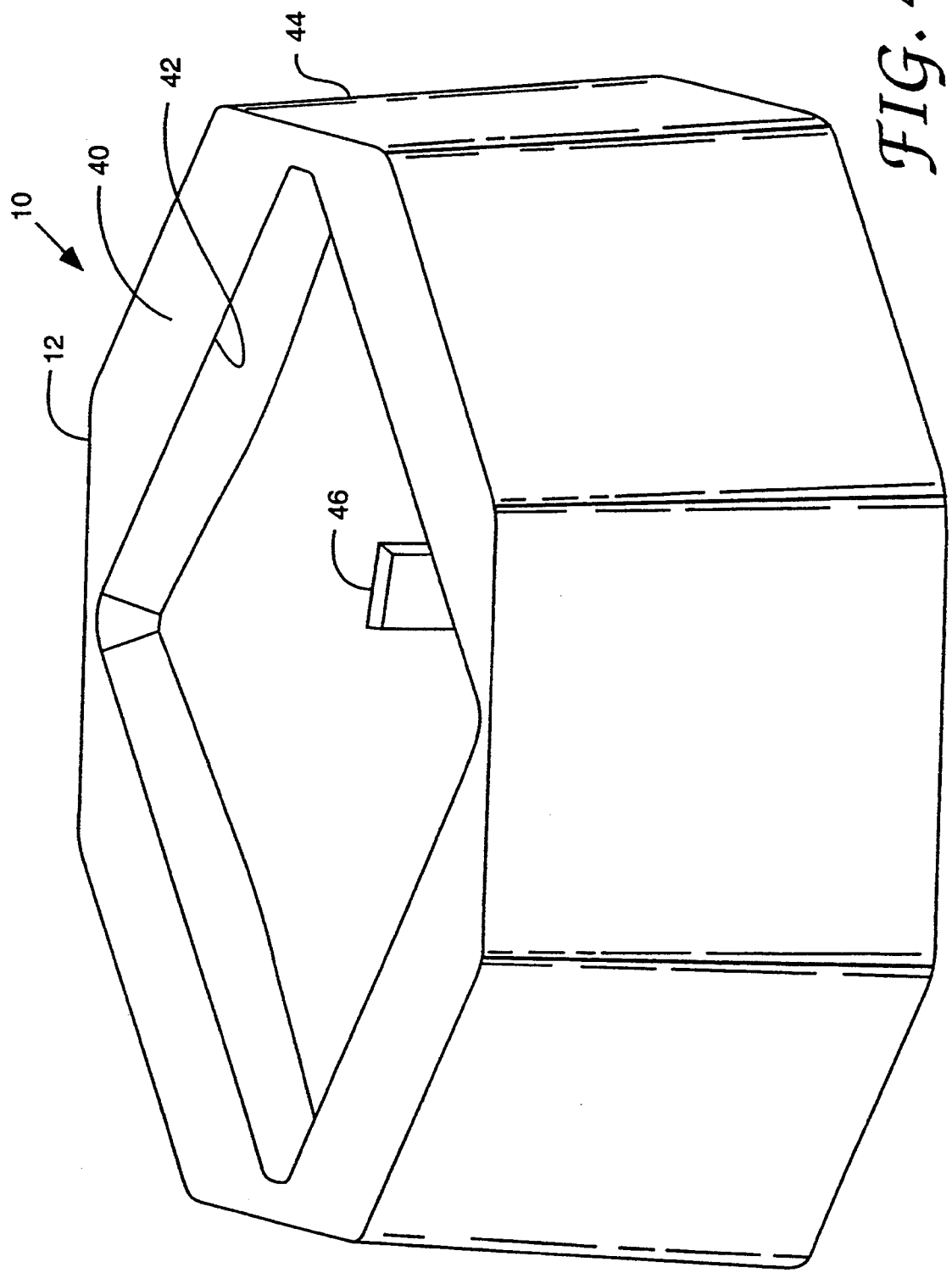
FIG. 4 is a perspective view of one part of the socket of FIG. 1.

The shell 12 is best seen in FIGS. 3 and 4 and includes a top surface 40 with an opening 42 formed to accept the integrated circuit device 16 and allow the same to be placed in the nest 14 with its contacts touching the terminals 32. The shell 12 includes outer walls 44 extending downwardly from the top surface 40 toward the base 18, which walls 44 provide purchase to rotate the shell 12. Formed on the interior of the shell outer walls 44 are projections 46 which fit under the base shoulder 22 and extend toward the base perimeter 20 when in place. The projections 46 prevent the shell 12 from detaching from the base 18 and the nest 14. Since the projections 46 are narrow, the shell 12 may be rotated until the projections 46 encounter the stops 24 disposed on the perimeter 20 of the base 18. The top surface 40 of the shell 12 may be formed with relief pockets 48 to facilitate molding of the projections 46. It will be recognized that the entire expanse of the outer walls 44 need not be present for the shell 12 to function. Only those portions of the walls 44 which include the projections 46 are necessary.

Referring back to FIGS. 1 and 2 in particular, the shell 12 includes camming surfaces 50 which slope downwardly from the corners of the shell opening 42 and terminate in flat surfaces 52 disposed midway along the length of the sides of the opening 42. The camming surfaces 50 and flat surfaces 52 are essentially mirror images of corresponding structures formed on the nest 14 and are designed such that the flat surfaces of the nest 38 and the flat surfaces of the shell 52 are in contact when the shell 12 is rotated to accept an integrated circuit device 16, as illustrated in FIGS. 1 and 3.

FIG. 5 illustrates terminals 32 which may be used in the embodiment of a socket illustrated in FIGS. 1-4 and thus far described. The terminals 32 include terminating portions 54 which extend through the holes 26 formed in the base 12 and which are permanently connected to the printed circuit board on which the socket 10 is to be mounted. Opposite the terminating portions 54 are contacting portions 56 shaped to provide a flat top surface to contact the contacts formed on the lower surface of the integrated circuit device 16. Between the termination portion 54 and the contacting portion 56 is a spring portion 58 formed in the shape of a bow, although many other shapes are possible. The shape of the spring portion 58 allows resilient deflection of the contacting portion 56 toward the terminating portion 54 and acts to generate a force, when the terminal 32 is acted upon axially, which tends to urge the contacting portion 56 away from the terminating portion 54. The terminals 32 may be formed with projections 60 which engage the underside of the holes 30 in the nest 14, and the length of the terminals 32 is selected such that the nest 14 will be urged upwardly when the terminals 32 and the nest 14 are assembled to the base 18.

With reference back to FIG. 3, the assembled socket 10 will include an array of terminals 32 within the holes 30 in the nest 14 which tend to urge the nest 14 upwardly away from the base 18 and toward the shell 12, if the terminals are formed with projections 60. Thus the terminals 32 will be extended as far as the projections 60 will allow through the holes 30 in the nest 14 and the flat surface 38 of the nest camming surface 36 will be forced against the shell flat surface 52 when the shell 12 is positioned to accept an integrated circuit device 16. In this position, the upward force of the terminals 32 is countered by a reaction force generated downwardly by the shell 12 because movement of the shell 12 is limited by its projections 46 in engagement with the shoulder 22 of the base.

When an integrated circuit device 16 has been positioned in the nest 16 and the shell 12 rotated from the position of FIG. 3 to the position of FIG. 4, the flat surfaces 38 and 52 allow a period wherein the shell 12 can rotate to contact the integrated circuit 16 without any movement of the nest 14 occurring. Once contact between the Camming surface 50 of the shell 12 has been initiated, the downward reaction force generated by the shell 12 is transferred from the nest 14 to the integrated circuit device 16. When the shell 12 has rotated to the position shown in FIG. 4, all reaction force generated by the shell camming surface 50 by virtue of engagement between the shell wall projections 46 and the shoulder 22 of the base 18 is exerted on the corners of the integrated circuit device 16. This force maintains the original deformation or causes increased compression of the terminals 32 and ensures good electrical contact between the contacts of the integrated circuit device 16 and the contacting portions 56 of the terminals 32. Rotation of the shell 12 is halted upon reaching the position shown in FIG. 4 by the stops 24 attached to the base 18. Return rotation transfers the reaction force generated by the shell 12 from the integrated circuit device 16 back to the camming surfaces 36 and ultimately the flat surface 38.

Figure 6:
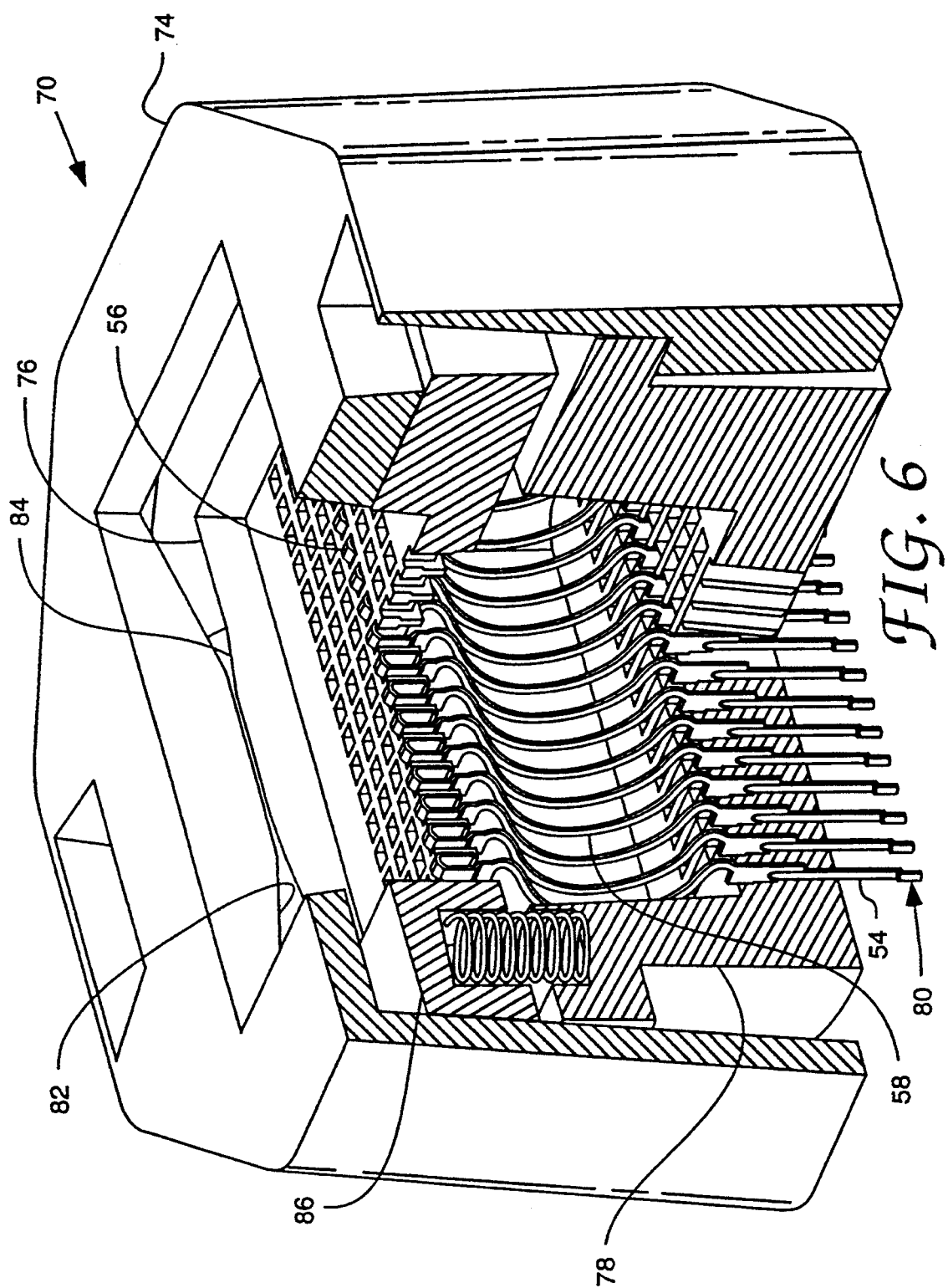
FIG. 6 is a perspective view, partially in cross-section, of the socket of FIG. 5.
Figure 7:
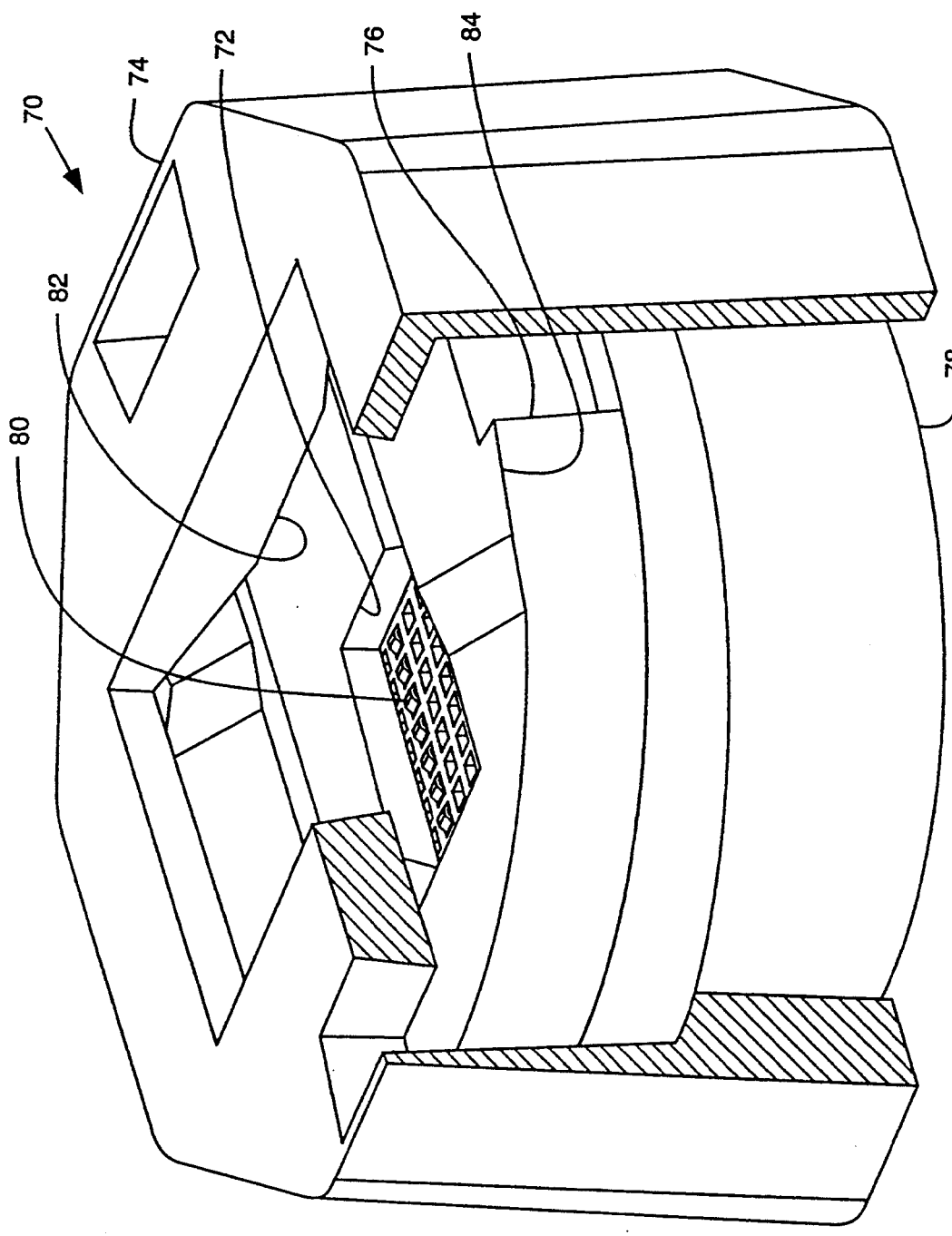
FIG. 7 is a perspective view of the socket of FIG. 5 with a portion in cross-section and an integrated circuit device in place for testing.

FIGS. 6 and 7 illustrate a second embodiment of a socket 70 which incorporates a number of changes as compared to the socket 10 described above. The socket 70 is designed for use with rectangular integrated circuit device 72 and is designed such that the shell 74 rotates 90° with respect to the nest 76 and the base 78 to capture the integrated circuit device 72 rather than the 45° of the earlier-described socket 10. Also, the socket 70 utilizes terminals 80 which do not include projections 60 as do the terminals 32.

The result of 90° rotation is that the shell 74 only includes two camming surfaces 82 rather than the four illustrated previously. Likewise, the nest 76 only includes two camming surfaces 84. Otherwise, operation is similar in that when the shell 74 rotates from the position shown in FIG. 6 to that shown in FIG. 7, the downwardly-acting reaction force of the shell 74 is transferred from the nest 76 to the integrated circuit device 72.

The result of utilizing terminals 80 without projections 60 is that the terminals 80 extend further through the holes in the nest 76 than described earlier and the nest 76 may not be urged by the terminals 80 into contact with the shell 74. In order to maintain the nest 76 in contact with the shell 74 and to prevent the terminals 80 from extending an undue distance above the surface of the nest 76, the socket 70 is provided with auxiliary springs 86 disposed between the base 78 and the nest 76 which urge the nest 76 upwardly into engagement with the shell 74.

Thus there has been described in two embodiments a socket which utilizes rotation of an outer shell to achieve temporary connection of an integrated circuit to a printed circuit board of a testing device. Although the present invention was described in two embodiments, many modifications will be apparent to those skilled in the art. For example, the camming surfaces on the nests or the shells or on both the nests and the shells could be eliminated if the dimensions of the shell and the nest were carefully chosen with respect to the integrated circuit device to be tested and the user were willing to accept a somewhat less graceful transfer of forces between the nest and the device than results with the provision of the camming surfaces as described herein. Further, the shape of the device is not determinative of the extent of rotation for which the shell of the socket should be designed. While 90° rotation is presently thought most desirable for rectangular devices, the socket of FIGS. 6 and 7 could be designed to capture only the corners of the device as described with respect to the square device, and either socket version could be made to capture an integrated circuit device with more or less rotation than the optimum described herein.

I claim:

1. A socket for temporarily connecting to a printed circuit board an integrated circuit device of the type including a body having spaced, planar major surfaces and a number of contacts disposed on one major surface and arranged in an array, the socket comprising:

a base adapted for mounting on the printed circuit board and including an array of holes;

a nest overlying said base and including means for preventing rotation of said nest with respect to said base and an array of holes and means for locating the integrated circuit with respect to said array of holes in said nest;

terminals extending through said array of holes in said base and corresponding holes of said array of holes in said nest to form an array of terminals disposed to make connection with the integrated circuit contacts, said terminals including a termination portion for electrical connection to the printed circuit board, a contacting portion for electrical connection to the contacts of the integrated circuit, and a spring portion connecting said terminal portion and said contacting portion and resiliently deformable to allow movement of said contacting portion toward said terminal portion and to produce a force resisting such movement;

a shell including a top surface overlying said nest, means extending from said top surface and engaging said base for retaining said shell in relation to said base and for allowing rotational movement of said shell with respect to said base, an opening in said top surface permitting passage of the integrated circuit through said top surface, and means for applying force upon rotation of said shell with respect to said base and said nest to the major surface of an integrated circuit disposed on said nest and in contact with terminals corresponding to the array of contacts on the integrated circuit sufficient to force the integrated circuit into electrical engagement with said contacting portions of said terminals and cause resilient deformation of said spring portions of the terminals engaged by said integrated circuit.

2. A socket according to claim 1 wherein said means for locating the integrated circuit with respect to said nest are a flat surface including said array of holes in said nest and walls extending in a common direction from said flat surface and disposed around said array of holes to define a raised border corresponding to the shape of the integrated circuit.

3. A socket according to claim 1 wherein said base includes a circular perimeter and said means for retaining said shell in relation to said base are a circular shoulder of increased diameter relative to said base perimeter and a plurality of projections extending toward said base perimeter from said shell to engage said base shoulder.

4. A socket according to claim 1 wherein said means for applying force to the integrated circuit includes at least two camming surfaces extending from said shell top surface toward said nest and wherein said shell camming surfaces engage said nest when said shell is in a loading position wherein said shell top surface opening is rotated to allow insertion of the integrated circuit through said shell and onto said nest and wherein said shell camming surfaces disengage from said nest and engage said integrated circuit when said shell is rotated to a test position wherein force is applied to the integrated circuit.

5. A socket according to claim 4 further including at least two camming surface extending from said nest and interacting with said shell camming surface when said shell is rotated to a loading position wherein said nest is forced away from said shell against said resilient deformation of said terminals, and wherein said force is applied to said integrated circuit by rotation of said shell away from said loading position so that said shell camming surfaces rotate out of engagement with said nest camming surfaces to engage said integrated circuit.

6. A socket according to claim 1 wherein said base includes a circular perimeter and said means for applying force to the integrated circuit are a circular shoulder of increased diameter relative to said base perimeter and sloping with respect to said shell top surface and a plurality of projections extending toward said base perimeter from said shell to engage said base shoulder so that said shell will move toward and away from said nest and an integrated circuit disposed thereon as said shell projections move along said sloped shoulder.

7. A socket according to claim 1 further including a biasing meter disposed between said base and said nest for urging said nest away from said base and toward said shell.

8. A socket according to claim 1 wherein said array of holes in said nest is square, said shell opening is square to correspond to said nest, said nest includes four camming surfaces disposed adjacent each of the sides of said array, and said shell top surface includes four camming surfaces disposed to correspond to said nest camming surfaces when said shell is rotated such that said shell opening is aligned with said nest array, said shell camming surfaces disengaging from said nest camming surfaces and engaging said integrated circuit upon rotation of said shell with respect to said nest to apply said force to said integrated circuit.

9. A socket for temporarily connecting to a printed circuit board an integrated circuit device of the type including a body having spaced, planar major surfaces and a number of contacts disposed on one major surface and arranged in an array, the socket comprising:

a base adapted for mounting on the printed circuit board and including a substantially circular perimeter, a shoulder of increased diameter with respect to said perimeter, a substantially flat surface spaced from said printed circuit board and an array of holes in said flat surface;

a nest having a substantially flat surface overlying said base and an array of holes in said flat surface, said nest engaging said base to prevent rotation of said nest with respect to said base and further including walls extending from said flat surface toward said base and disposed adjacent said array of holes for locating the integrated circuit with respect to said array of holes in said nest;

terminals extending through said array of holes in said base and corresponding holes of said array of holes in said nest to form an array of terminals disposed to make connection with the integrated circuit contacts, said terminals including a termination portion for electrical connection to the printed circuit board, a contacting portion for electrical connection to the contacts of the integrated circuit, and a spring portion connecting said terminal portion and said contacting portion and resiliently deformable to allow movement of said contacting portion toward said terminal portion and to produce a force resisting such movement;

a shell including a top surface overlying said nest, a wall extending from said top surface toward said base and including at least one projection engaging said shoulder to retain said shell in relation to said base and to allow rotational movement of said shell with respect to said base an opening in said top surface substantially corresponding to said array of holes in said nest and permitting passage of the integrated circuit through said top surface, and means for applying force upon rotation of said shell with respect to said base and said nest to the major surface of an integrated circuit disposed on said nest and in contact with terminals corresponding to the array of contacts on the integrated circuit sufficient to force the integrated circuit into electrical engagement with said contacting portions of said terminals and cause resilient deformation of said spring portions of the terminals engaged by said integrated circuit.

10. A socket according to claim 9 wherein said means for applying force to said integrated circuit are at least two camming surfaces said shell opening and extending toward said nest to engage the integrated circuit upon rotation of said shell.

11. A socket according to claim 9 wherein said means for applying force to said integrated circuit is a sloped surface of said base shoulder engaging said shell projection such that rotation of said shell projection relative to said base shoulder allows said shell to move toward and away from said nest and said shell to apply force to an integrated circuit disposed on said nest when said shell moves toward said base.

* * * * *